United States Patent
Jeong

(10) Patent No.: US 9,787,809 B2
(45) Date of Patent: Oct. 10, 2017

(54) ELECTRONIC DEVICE WITH EXTERIOR METAL FRAME ANTENNA

(71) Applicant: Samsung Electronics Co., Ltd., Gyeonggi-do (KR)

(72) Inventor: Woo-Young Jeong, Seoul (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/205,341

(22) Filed: Jul. 8, 2016

(65) Prior Publication Data
US 2017/0048366 A1    Feb. 16, 2017

(30) Foreign Application Priority Data

Aug. 13, 2015 (KR) .................. 10-2015-0114557

(51) Int. Cl.
*H04M 1/00* (2006.01)
*H04M 1/02* (2006.01)
*H05K 1/02* (2006.01)

(52) U.S. Cl.
CPC ........ *H04M 1/0277* (2013.01); *H05K 1/0215* (2013.01); *H05K 1/0259* (2013.01)

(58) Field of Classification Search
CPC .. H04M 1/0266; H04M 1/0249; H04M 1/185; H04M 1/0277; H04M 1/0254; H04M 1/026; H04M 1/0283; H04M 1/03; H04M 1/23; H01Q 1/243; H01Q 1/44; H01Q 9/0421; H01Q 13/103; H01Q 1/245; H01Q 1/40; G06F 1/1626; G06F 1/1656; G06F 1/1601; G06F 1/1616; G06F 1/1637; G06F 1/1658
See application file for complete search history.

(56) References Cited

U.S. PATENT DOCUMENTS

| | | | |
|---|---|---|---|
| 7,307,592 B2 | 12/2007 | Park et al. | |
| 2012/0146863 A1* | 6/2012 | Kwon | H01Q 1/243 343/720 |
| 2014/0085836 A1* | 3/2014 | Mo | H05K 5/0017 361/749 |
| 2015/0155614 A1* | 6/2015 | Youn | H04M 1/0249 343/702 |
| 2016/0057899 A1* | 2/2016 | Chien | H04B 1/3888 455/575.8 |

FOREIGN PATENT DOCUMENTS

| | | |
|---|---|---|
| KR | 10-2007-0025371 | 3/2007 |
| KR | 10-2015-0009002 | 1/2015 |

* cited by examiner

*Primary Examiner* — Golam Sorowar
(74) *Attorney, Agent, or Firm* — The Farrell Law Firm, P.C.

(57) ABSTRACT

Disclosed is an electronic device that includes a housing; a printed circuit board disposed within the housing; a communication circuit disposed on the printed circuit board; at least one exterior metal frame forming at least a part of the housing, and is electrically connected with the communication circuit; a first electric path that electrically connecting the at least one exterior metal frame and the printed circuit board with each other; a support structure including a metal region and a non-metal region, and supporting the printed circuit board and/or the at least one exterior metal frame; and a second electric path disposed between the printed circuit board and the metal region of the support structure and is electrically connected with the first electric path.

19 Claims, 13 Drawing Sheets

ELECTRONIC DEVICE WITH EXTERIOR METAL FRAME ANTENNA

PRIORITY

This application claims priority under 35 U.S.C. §119(a) to Korean Patent Application Serial No. 10-2015-0114557, which was filed in the Korean Intellectual Property Office on Aug. 13, 2015, the entire content of which is incorporated herein by reference.

BACKGROUND

1. Field of the Disclosure

The present disclosure generally relates to an electronic device, and more particularly, to an electronic device in which an exterior metal frame acts as an antenna radiator.

2. Description of the Related Art

An electronic device having a communication function may provide a mobile communication service using an antenna. The antenna may be formed in some regions of the inside and outside of the housing of the electronic device. The antenna may be formed as a pattern on a printed circuit board (PCB), or may be positioned inside the housing by being formed inside the housing, such as on a speaker device, or on a flexible PCB (FPCB).

In addition, there may be a Metal Device Antenna (MDA) that utilizes a mechanical metal product formed as a radiator, a bezel-antenna that utilizes a metal housing as a radiator, and the like.

When at least one mechanical metal product is formed on the housing as an antenna radiator of an electronic device, static electricity may be introduced into the housing through the at least one mechanical metal product (e.g., a metal frame), and the introduced static electricity may be transferred to a PCB and cause damage to at least a part of the PCB. For example, at least a part of high speed data processing unit disposed on the PCB may be damaged.

SUMMARY

Various embodiments of the present disclosure may provide an electronic device in which an antenna is mounted, which has an improved ESD (electrostatic discharge) performance while not deteriorating a radio frequency (RF) performance in the electronic device to which an exterior metal frame structure is applied.

Various embodiments of the present disclosure also provide an electronic device in which static electricity transferred through an exterior metal frame is prevented from being directed to various data processing units mounted on a PCB, thereby preventing damage to the PCB.

According to various embodiments of the present disclosure, an electronic device includes a housing; a printed circuit board that is disposed within the housing; a communication circuit that is disposed on the printed circuit board; at least one exterior metal frame that forms at least a part of the housing, and is electrically connected with the communication circuit; a first electric path that is electrically connected to the at least one exterior metal frame and the printed circuit board with each other; a support structure that includes a metal region and a non-metal region, and supports the printed circuit board and/or the at least one exterior metal frame; and a second electric path that is disposed between the printed circuit board and the metal region of the support structure and is electrically connected with the first electric path.

According to various embodiments of the present disclosure, an electronic device includes a printed circuit board within the electronic device; a first segmented antenna radiator that forms at least a part of an exterior of the electronic device; a first contact that electrically connects the first segmented antenna radiator and the printed circuit board with each other; a support structure that includes a metal region and a non-metal region, and supports the printed circuit board and/or the first segmented antenna radiator; and a second contact that is disposed between the printed circuit board and the metal region and is electrically connected with the first contact.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
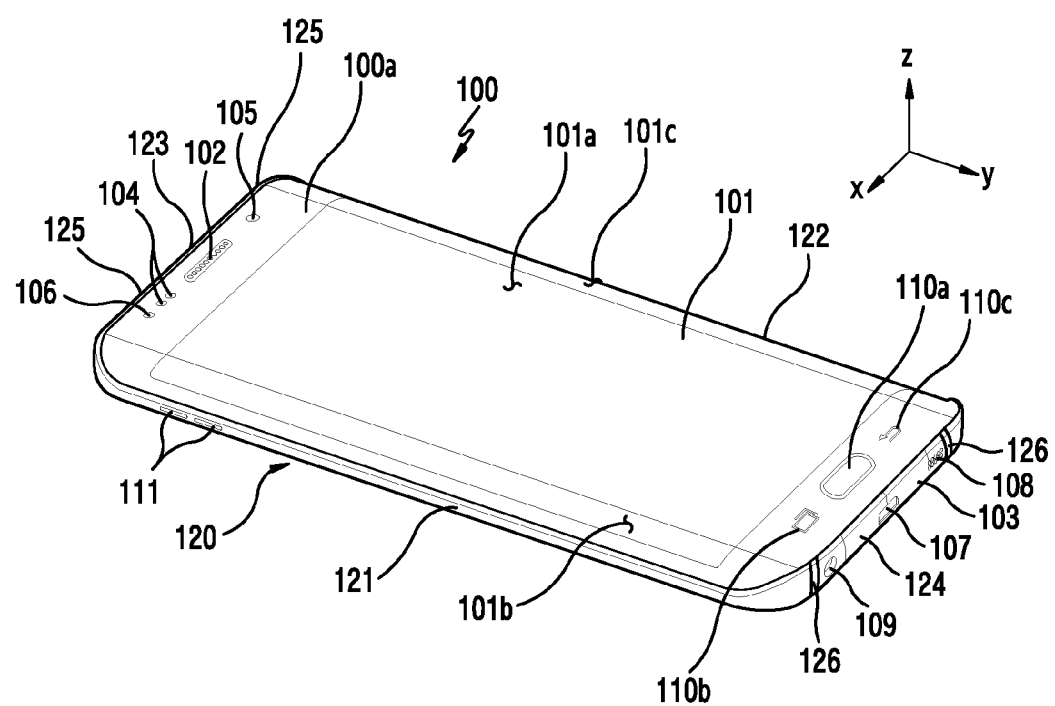
FIG. 1 is a perspective view illustrating a front part of an electronic device according to various embodiments of the present disclosure.

Hereinafter, various embodiments of the present disclosure will be explained with reference to the accompanying drawings. Although specific embodiments of the present disclosure are illustrated in the drawings and relevant detailed descriptions are provided, various changes can be made and various embodiments may be provided. Accordingly, various embodiments of the present disclosure are not limited to the specific embodiments and should be construed as including all changes and/or equivalents or substitutes included in the ideas and technological scopes of embodiments of the present disclosure. In the explanation of the drawings, similar reference numerals are used for similar elements.

The terms "include" or "may include" used in describing embodiments of the present disclosure indicate the presence of disclosed corresponding functions, operations, elements, and the like, and do not limit additional one or more functions, operations, elements, and the like. In addition, it should be understood that the terms "include" or "have" used in describing embodiments of the present disclosure indicate the presence of features, numbers, steps, operations, elements, parts, or a combination thereof described in this specification, and do not preclude the presence or addition of one or more other features, numbers, steps, operations, elements, parts, or a combination thereof.

The term "or" used in describing embodiments of the present disclosure include any and all combinations of words enumerated with it. For example, "A or B" means including A, including B, or including both A and B.

Although terms such as "first" and "second" used in describing the various embodiments of the present disclosure may modify various elements, these terms do not limit the corresponding elements. For example, these terms do not limit an order and/or importance of the corresponding elements. These terms may be used for the purpose of distinguishing one element from another element. For example, a first electronic device and a second electronic device all indicate electronic devices and may indicate different electronic devices. For example, a first element may be referred to as a second element without departing from the scope of the various embodiments of the present invention, and similarly, a second element may be referred to as a first element.

It will be understood that, when an element is mentioned as being "connected" or "coupled" to another element, the element may be directly connected or coupled to another element, and there may be an intervening element between the element and another element. To the contrary, it will be understood that, when an element is mentioned as being "directly connected" or "directly coupled" to another element, there is no intervening element between the element and another element.

The terms used in describing the various embodiments of the present disclosure are for the purpose of describing specific embodiments only and are not intended to limit various embodiments of the present disclosure. As used herein, the singular forms are intended to include the plural forms as well, unless the context clearly indicates otherwise. All of the terms used herein including technical or scientific terms have the same meanings as those generally understood by an ordinary skilled person in the related art unless they are defined otherwise. The terms defined in a generally used dictionary should be interpreted as having the same meanings as the contextual meanings of the relevant technology and should not be interpreted as having ideal or exaggerated meanings unless they are clearly so defined.

An electronic device according to various embodiments of the present disclosure may be a device that is equipped with a communication function. For example, the electronic device may include at least one of a smartphone, a tablet personal computer (PC), a mobile phone, a video phone, an electronic book reader, a desktop PC, a laptop PC, a netbook computer, a Personal Digital Assistant (PDA), a Portable Multimedia Player (PMP), an MP3 player, a mobile medical machine, a camera, or a wearable device (for example, a head-mounted-device (HMD) such as electronic glasses, electronic clothing, an electronic bracelet, an electronic necklace, an electronic appcessory, electronic tattoos, or a smart watch).

The electronic device according to various embodiments of the present disclosure may be one or a combination of one or more of the above-mentioned devices. In addition, the electronic device according to various embodiments of the present disclosure may be a flexible device. In addition, it is obvious to an ordinary skilled person in the related art that the electronic device according to various embodiments of the present disclosure is not limited to the above-mentioned devices.

Hereinafter, an electronic device according to various embodiments will be explained with reference to the accompanying drawings. The term "user" used in describing the various embodiments may refer to a person who uses the electronic device or a device that uses the electronic device (for example, an artificial intelligence electronic device).

Figure 2:
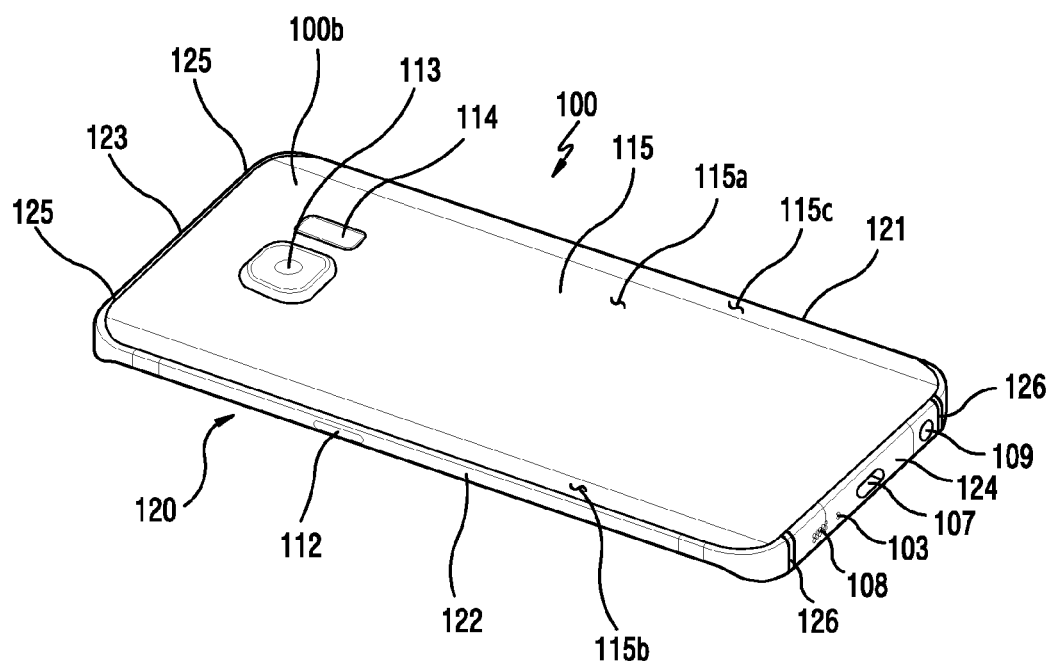
FIG. 2 is a perspective view illustrating a rear part of the electronic device according to various embodiments of the present disclosure.

FIG. 1 is a perspective view illustrating a front part of an electronic device, and FIG. 2 is a perspective view illustrating a rear part of the electronic device according to various embodiments of the present disclosure.

Referring to FIGS. 1 and 2, an electronic device 100 may include a display 101 (which may also be referred to as a touch screen) mounted on the front part thereof. A receiver (or speaker) 102 may be disposed above the display 101 to receive a voice of a counterpart. A microphone 103 may be disposed below the display 101 to send a voice of the user of the electronic device to the counterpart.

Components for performing various functions of the electronic device 100 may be disposed around the portion where the receiver or speaker 102 is installed. The components may include at least one sensor module 104. The sensor module 104 may include at least one of, for example, an illuminance sensor (e.g., an optical sensor), a proximity sensor (e.g., an optical sensor), an infrared sensor, and an ultrasonic sensor. According to one embodiment, the components may include a front camera 105, and an indicator 106 that allows the user to recognize state information of electronic device 100.

The display 101 may be formed in a large size to occupy the greater part of the front surface of the electronic device 100. The term "main home screen" refers to a first screen that is displayed on the display 101 when the power of the electronic device 100 is turned ON. In addition, in a case where the electronic device 100 includes a plurality pages of different home screens, the main home screen may be the first home screen among the plurality pages of home screens. On the home screen, shortcut icons for executing frequently used applications, a main menu switch key, time, date, weather, etc. may be displayed. The main menu switch key causes a menu screen to be displayed on the display 101. In addition, in the top end portion of the display 101, a state bar may be formed which displays a state of the electronic device 100, such as a battery charge state, an intensity of a received signal, or the present time. On the front surface 100a, below the display 101, at least one key may be disposed. For example, a home key 110a, a menu key 110b, and a back key 110c may be formed. The home key 110a is a physical key that is operated by a pushing operation.

However, the home key as the physical key may be omitted, and may be replaced by a home key that is operated by a touch operation or the like. In addition, the menu key 110b or the back key 110c may be replaced by another function key that performs other functions.

The home key 110a causes a main home screen to be displayed on the display 101. For example, when the home key 110a is touched in a state where a home screen different from the main home screen or a menu screen is displayed on the display 101, the main home screen may be displayed on the display 101. In addition, when the home key 110a is touched while applications are executed on the display 101, the main home screen may be displayed on the display 101. As another example, the home key 110a may also be used for causing recently used applications to be displayed on the display 101, or for causing a task manager to be displayed.

According to various embodiments, the home key button 110a positioned at the center may perform a home key button function. A fingerprint recognition sensor device may be disposed on the top surface of the home key button 110a. The home key button 110a may perform a first function (e.g., a home screen return function, a wake-up/sleep function, or the like) by a physically pushing action, and may perform a second function (e.g., a fingerprint recognition function or the like) by an action of swiping the top surface of the home key button 110a.

According to various embodiments, the menu key 110b provides a connection menu to be available on the display 101. The connection menu may include a widget addition menu, a background screen change menu, a retrieve menu, an edition menu, an environment setting menu, or the like. The back key 110c may cause a screen, which was executed just prior to the currently executed screen, to be displayed, or the most recently used application to be terminated.

According to various embodiments, the electronic device 100 may include a metal frame 120 as a housing. For example, the metal frame 120 may form at least a part of the housing and may have one or more exterior metal frames. The one or more exterior metal frames may be arranged in a segmented manner to operate as an antenna radiator. One or more metal frames 120 may be arranged along the periphery, on which the side surfaces of the electronic device exist.

For example, a metal housing includes a top surface, a bottom surface, and peripheral side surfaces, at least one of which may be made of a metal material. In another example, the top surface and/or the bottom surface of the metal housing may further include a synthetic resin or a glass series material. In still another example, only the peripheral side surfaces of the metal housing may be constructed with a metal frame. In yet another example, the bottom surface may be formed to be integrated with the electronic device 100 or to be removable from the electronic device 100.

According to various embodiments, the metal frame 120 may be disposed along the periphery of the electronic device 100, and may be disposed to be expanded to at least some regions of the rear surface of the electronic device which are continuous with the periphery. In another example, the metal frame 120 may define at least a part of the thickness of the electronic device 100 along the periphery of the electronic device 100, and may be formed in a closed loop shape or a segmented shape. However, without being limited to this, the metal frame 120 may be a part that forms the thickness of the electronic device 100.

According to various embodiments, the metal frame 120 may be arranged only in at least some regions in the periphery of the electronic device 100. For example, when the metal frame 120 forms a part of the housing of the electronic device 100, the remaining portion of the housing may be replaced by a non-metal member. For example, the housing may be formed in a manner where the non-metal member is molded to the metal frame 120 through insert injection molding.

According to various embodiments, the metal frame 120 may include one or more cut-off portions 125 and 126 so that unit metal frames, separated from each other by the cut-off portions 125 and 126, may be utilized as an antenna radiator. For example, the cut-off portions 125 and 126 may be formed together when the non-metal is molded to the metal member through insert injection molding.

According to various embodiments, a top frame 123 may act as an antenna radiator as a unit frame by one pair of cut-off portions 125, which are formed at a predetermined interval. The cut-off portions are described as one pair of cut-off portions according to various embodiments. However, without limiting to this, the top frame may or may not include at least one cut-off portion.

According to various embodiments, the bottom frame 124 may act as an antenna radiator as a unit frame by one pair of cut-off portions 126, which are formed at a predetermined interval. According to various embodiments, the metal frame 120 is disposed along the periphery of the electronic device 100 to have a segmented shape or a closed loop shape, and may be disposed to form the thickness of the electronic device 100. According to another embodiment, when the electronic device 100 is viewed from the front side, the metal frame 120 may include a left frame 121, a right frame 122 (as shown in FIG. 2), a top frame 123, and a bottom frame 124.

According to various embodiments, on the bottom frame 124 of the electronic device, various electronic components may be disposed. For example, a speaker 108 may be disposed at one side of the microphone 103. In still another example, at the other side of the microphone 103, an interface connector 107 may be disposed. The interface connector 107 is used for a data transmission/reception function with an external function and/or a function of charging the electronic device 100 by receiving external power applied thereto. In yet another example, at one side of the interface connector 107, an ear jack hole 109 may be disposed. In yet another example, all the above-mentioned microphone 103, speaker 108, interface connector 107, and ear jack hole 109 may be disposed within the region of the unit frame formed by one pair of cut-off portions 126 disposed in the bottom frame 124. However, without being limited thereto, at least one of the above-described electronic components may be disposed in a region including the cut-off portion 126 or outside the unit frame.

According to various embodiments, on the left frame 121 of the metal frame 120, one or more first side key buttons 111 may be disposed. For example, one pair of first side key buttons 111 may be disposed on the left frame 121 to partially protrude so as to perform a volume up/down function, a scroll function, or the like.

According to various embodiments, as shown in FIG. 2, on the right frame 122 of the metal frame 120, one or more second side key buttons 112 may be disposed. The second side key buttons 112 may perform a power ON/OFF function, an electronic device wake-up/sleep function, or the like.

As shown in FIG. 2, on the rear surface 100b of the electronic device 100, a rear camera 113 may be disposed, and at one side of the rear camera 113, at least one electronic component 114 may be disposed. For example, the electronic component 114 may include at least one of an illuminance sensor (e.g., an optical sensor), a proximity sensor (e.g., an optical sensor), an infrared sensor, an ultrasonic sensor, a heart rate sensor, and a flash device.

According to various embodiments, the front surface 100a including the display 101 may include a flat surface portion 101a, a left curved surface portion 101b, and a right curved surface portion 101c, which are formed on the left and right sides of the flat surface portion 101a, respectively. According to another example, the front surface 100a of the electronic device 100 may include both of a display region 101 and another region (e.g., a BM (black matrix) region) by using one window. According to still another example, the left and right curved surface portions 101b and 101c may be formed to extend from the flat surface portion 101a in an X-axis direction of the electronic device 100. According to still another example, the left and right curved surface portions 101b and 101c may be formed as a part of the side surfaces of the electronic device 100. For example, the left and right curved surface portions 101b and 101c and the left and right frames 121 and 122 of the metal frame 120 may be formed as the side surfaces of the electronic device 100 in unison. However, without being limited thereto, the front surface 100a including the display 101 may include at least one of the left and right curved surface portions 101b and 101c. According to various embodiments, the front surface 100a may be configured to include only the left curved surface portion 101b along the flat surface portion 101a, or to include only the right curved surface portion 101c along the flat surface portion 101a.

Figure 3:
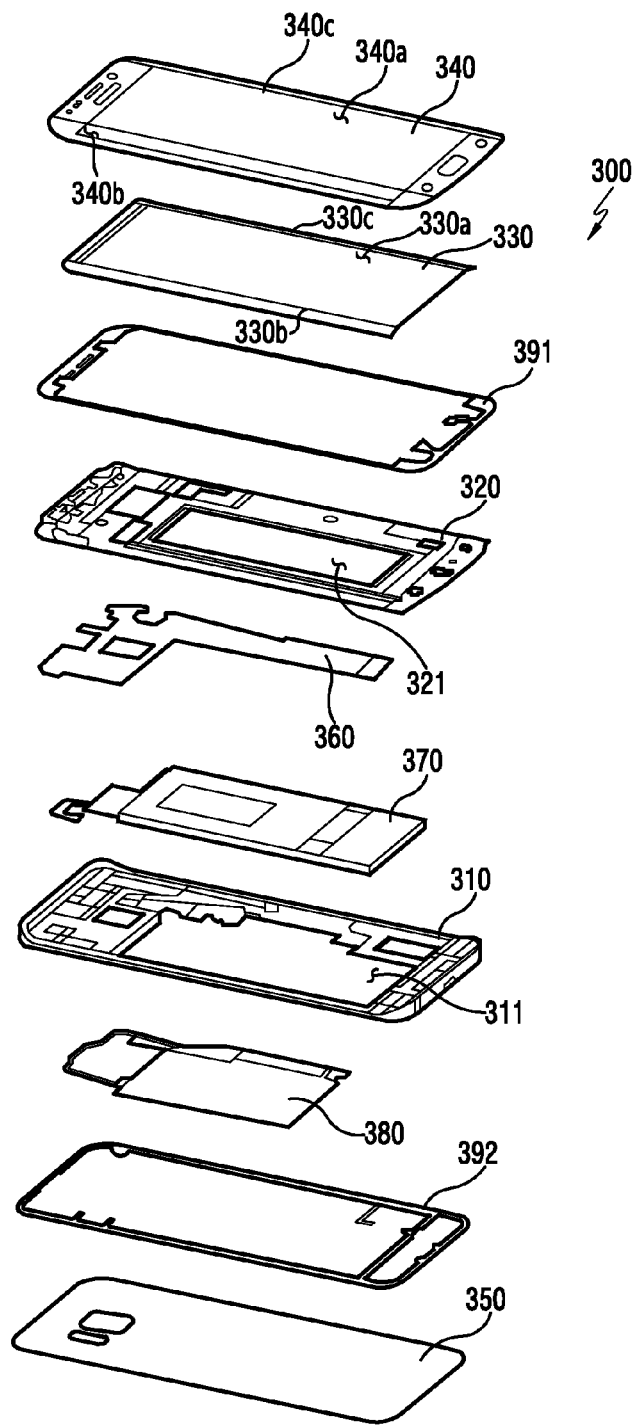
FIG. 3 is an exploded perspective view illustrating an electronic device according to various embodiments of the present disclosure.

According to various embodiments, the front surface 100a may include a window 340 (as shown in FIG. 3) including curved surface portions 101b and 101c on the left and right sides thereof, and a flexible display module applied to at least a part of the region below the window. According to one embodiment, the window may be formed by simultaneously bending the front and rear surfaces (hereinafter, referred to as a "3D type"). However, without being limited thereto, the window may be formed by forming the left and right portions of the front surface in a curved shape and forming the rear surface in a flat surface (hereinafter, referred to as a "2.5D type)". In still another example, the window may be formed of a transparent glass material (e.g., sapphire glass) or a transparent synthetic resin material.

According to various embodiments, the electronic device 100 may control the display module to selectively display information. In one example, the electronic device 100 may control the display module to display a screen only in a part of the flat surface portion 101a. In still another example, the electronic device 100 may control the display module to display a screen with at least one of the left and right curved surface portions 101b and 101c together with the flat surface portion 101a. In yet another example, the electronic device 100 may control the display module to display a screen with only a part of at least one of the left and right curved surface portions 101b and 101c, excluding the flat surface portion 101a.

According to various embodiments, the rear surface 100b of the electronic device 100 may also be formed entirely by a member (window) 115 mounted on the rear exterior surface. According another example, the rear surface 100b may include a flat surface portion 115a that is formed substantially in the central portion thereof, and a left curved surface portion 115b and a right curved surface portion 115c, which are formed on the left and right sides of the flat surface portion 115a, respectively. The window 115 may be configured in the 2.5D manner, in which the left and right curved surface portions 115b, 115c of the external surface are formed in a curved shape, and the rear surface is formed as a flat surface. However, without being limited thereto, the window 115 may be formed as the 3D type similarly to the window disposed on the front surface 100a. The left and right curved surface portions 115b and 115c may be formed as a part of the side surfaces of the electronic device 100. For example, the left and right curved surface portions 115b and 115c and the left and right frames 121 and 122 of the metal frame 120 may be formed as side surfaces of the electronic device 100 in unison. However, without being limited thereto, the rear surface 100b may include only one of the left and right curved surface portions 115b and 115c. For example, the rear surface 100b may include only the left curved surface portion 115b along the flat surface portion 115a, or only the right curved surface portion 115c along the flat surface portion 115a.

According to various embodiments, the top left and right corner portions and bottom left and right corner portions of the front surface 100a may be formed to be inclined simultaneously in the X-axis, Y-axis, and Z-axis directions as the window is bent. With this shape, the top left and right corner portions and the bottom left and right corner portions of the metal frame 120 may be formed such that the heights of the side surfaces thereof are gradually lowered in height.

FIG. 3 is an exploded perspective view illustrating an electronic device according to various embodiments of the present disclosure.

Referring to FIG. 3, the electronic device 300 corresponds to the electronic device 100 illustrated in FIGS. 1 and 2. According to various embodiments, in the electronic device 300, above a housing 310, a PCB 360, a support structure or bracket 320, a display module 330, and a front window 340 may be arranged in a manner of being sequentially stacked upward from a housing 310. Below the housing 310, a wireless power transmission/reception member 380 and a rear window 350 may be arranged in a manner of being sequentially downward from the housing 310. A battery pack 370 is accommodated in an accommodation space 311 formed in the housing 310, and may be arranged to avoid the PCB 360. According to another example, the battery pack 370 and the PCB 360 may be arranged in parallel to each other without overlapping each other.

According to various embodiments, the display module 330 may be fixed to the support structure 320, and the front window 340 may be fixed by being attached to the support structure 320 by a first adhesive member 391. The rear window 350 may be fixed by being attached to the housing 310 by a second adhesive member 392.

According to various embodiments, the front window 340 may include a flat surface portion 340a, a left bent portion 340b, and a right bent portion 340c, which are bent from the flat surface portion 340a in opposite directions. The front window 340 may be positioned on the top portion of the electronic device 300 to form a front surface, and may be formed of a transparent material so as to allow a screen, which is displayed by the display module 330, to be viewed therethrough and to provide an input/output window for various sensors. Although a shape in which the left and right bent portions 340b and 340c are formed as a 3D type, is illustrated, a shape, in which the upper and lower portions as well as the left and rights are single-bent or a shape in which the upper, lower, left and right portions are double-bent, may be applied. On the rear surface of the front window 340, a touch panel may be further disposed which may receive a touch input signal from the outside.

According to various embodiments, the display module 330 may also be formed in a shape corresponding to that of the front window 340 (i.e., a shape having a corresponding curvature). The display module 330 may include left and right curved surface portions 330b and 330c at left and right sides of the flat surface portion 330a. A flexible display module may be used for the display module 330. In the case where the front window 340 is of a type in which its rear surface has a flat shape (hereinafter, referred to as a "2D type" or "2.5D" type), since the rear surface of the front window 340 is a flat surface, an ordinary LCD (Liquid Crystal Display) or an OCTA (On-Cell Tsp AMOLED) may be applied thereto.

According to various embodiments, the first adhesive member 391 fixes the front window 340 to the support structure or bracket 320 that is disposed inside the electronic device 300. For example, the first adhesive member 391 may be a tape, such as double-sided tape, or a liquid adhesive layer, such as a bonding agent. As another example, when double-sided tape is applied as the first adhesive member 391, an ordinary PET (PolyEthylene Terephthalate) material may be applied thereto as an inner base, or a functional base may be applied thereto. For example, a base, which is typically formed of a foam type or shock-resistant material, may be used so as to reinforce shock resistance, thereby preventing the front window from being destroyed by external impact.

According to various embodiments, the support structure 320 is used inside the electronic device 300 so as to reinforce the overall rigidity of the electronic device 300. For the support structure 320, at least one of Al, Mg, and STS may be used. In still another example, for the support structure 320, a high rigid plastic containing glass fibers may be used, or a metal and a plastic, i.e., a conductor and an insulator may be used in combination. For example, when a metal member and a non-metal member are used in combination, the support structure 320 may be formed by insert-molding the non-metal member on the metal member. The support structure 320 may be positioned on the rear surface of the display module 330, and may have a shape (curvature) that is similar to the shape of the rear surface of the display module 330 so as to support the display module 330. For example, an elastic member, such as sponge or rubber, an adhesive layer such as double-sided tape, or a single-sided tape, may be additionally disposed between support structure 320 and the display module 330 so as to protect the display module 330. For example, some sections of the support structure 320 may further include an available space for mounting a component or a marginal space in consideration of a change of a component caused during use, such as the swelling of the battery pack 370, and a including hole region 321. For example, in the hole region 321, a plate-shaped metal or composite material may be added as needed so as to reinforce the internal rigidity, or an auxiliary device for improving a thermal characteristic, an antenna characteristic, etc. may be further provided. For example, the support structure 320 is fastened to the housing (e.g., rear case) 310 so as to form a space therein, and one or more electronic components may be disposed in such a space. According to various embodiments, the electronic components may include PCB 360. Without being limited thereto, however, the electronic components may include not only the PCB 360, but also an antenna device, a sound device, a power device, a sensor device, etc.

According to various embodiments, the battery pack 370 supplies power to the electronic device 300. One surface of the battery pack 370 may be positioned close to the display module 330. The other surface of the battery pack 370 may be positioned close to the rear window 350. Thus, during the charging of the battery pack 370, when the volume of the battery pack 370 slightly swells up, the battery pack 370 may push a counterpart component (e.g., PCB or display unit) due to the increase of the volume so that deformation and fracture may be caused in the counterpart component. In order to prevent this, a predetermined space (swelling gap) may be provided between the battery pack 370 and the counterpart component (e.g., the display module 330 or the rear window 350) so as to protect the counterpart component. For Without being limited thereto, the battery pack 370 may be implemented to be removable when the rear window 350 is implemented to be integrally disposed in the electronic device 300 or may be removable from the electronic device.

The housing 310 may form the exterior of the electronic device 300 (e.g., a side surface including a metal bezel) and may be coupled to the support structure 320 so as to form an internal space. For example, the front window 340 may be disposed on the front surface of the housing 310, and the rear window 350 may be disposed on the rear surface of the housing 310. However, without being limited thereto, the rear surface may be diversely implemented by, for example, injection molding a synthetic resin, or using a metal or a composite of a metal and a synthetic resin. In still another example, a gap between internal structures, which are formed by the housing 310 and the rear window 350, may prevent the rear window 350 from being damaged by hitting against the internal structures when an external impact, such as dropping of the electronic device 300, occurs. According to various embodiments, the housing 310 may be equipped with at least one metal frame on at least a part of the peripheral side thereof. The metal frame may form the exterior as a part of the housing 310, and may operate as an antenna radiator. For example, when the housing 310 is coupled to the support structure 320, the metal frame provided on the housing 310 may have a structure to be engaged with the support structure 320. As will be described later, the metal frame may be engaged with the non-metal region of the support structure 320. In addition, since the metal frame requires a power feeding structure and a ground structure so as to operate as an antenna radiator, the metal frame may be electrically connected with the PCB 360 when the housing 310 and the support structure 320 are coupled to each other.

According to various embodiments, the wireless power transmission/reception member 380 may be disposed on the rear surface of the housing 310. For example, the wireless power transmission/reception member 380 usually has a thin film shape, and is disposed by being attached to a part of one surface of an internal mounting component or the inner surface of the housing 310, and in particular, to a region adjacent to the rear window 350. The wireless power transmission/reception member 380 includes a structure that contacts with the internally positioned PCB 360.

According to various embodiments, the wireless power transmission/reception member 380 may be embedded or attached as a component of the battery pack 370 or the like, or a part of the housing 310, and may be attached to a component and the housing 310 at the same time. The second adhesive member 392 fixes the rear window 350 to the housing 310 and may be similar to the first adhesive member 391.

According to various embodiments, the rear window 350 may be similar to the above-described front window 340. For example, the front surface of the rear window 350 (a surface exposed to the outside) may be formed to have an inclined curvature that increases toward both left and right ends. According to one embodiment, the rear surface of the rear window 350 is formed as a flat surface to be attached to the housing 310 by the second adhesive member 392.

Figure 4:
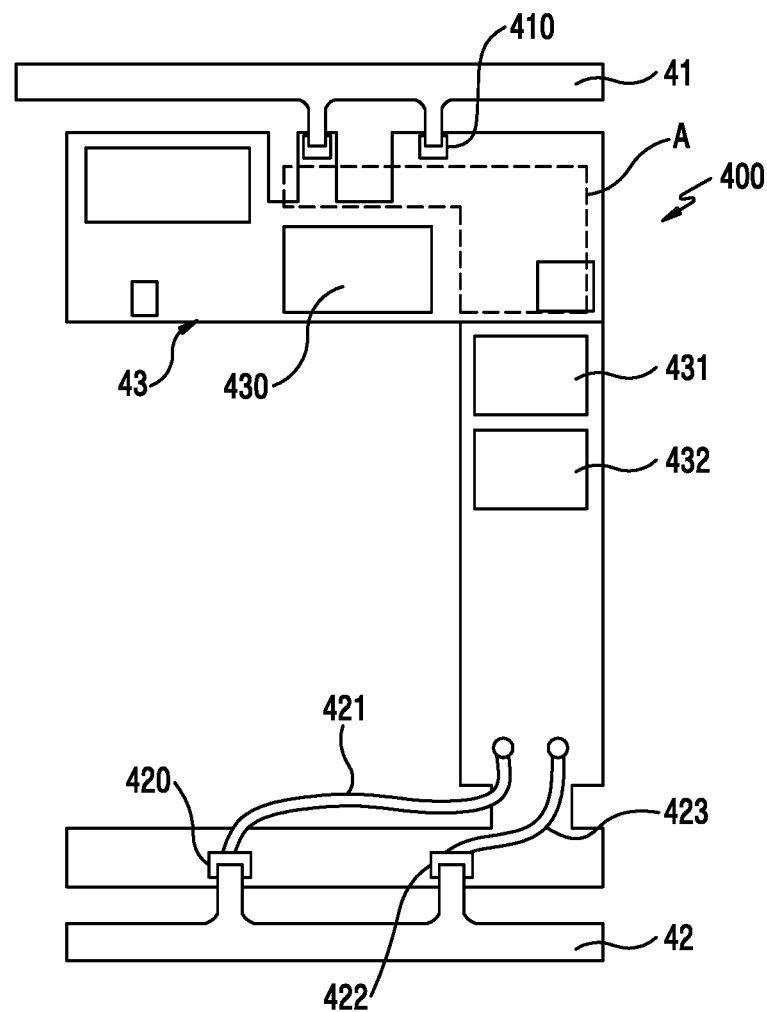
FIG. 4 is a front view illustrating a printed circuit board and exterior metal frames according to an embodiment of the present disclosure in a coupled state.

FIG. 4 is a front view illustrating a PCB and exterior metal frames according to an embodiment in a coupled state. The electronic device 400 illustrated in FIG. 4 may be a device which is the same as the electronic device 100 illustrated in FIGS. 1 and 2.

Referring to FIG. 4, the electronic device 400 may include exterior metal frames 41 and 42, a PCB 43, and antenna contacts 410, 420, and 422. Reference numeral 41 denotes a top exterior metal frame disposed on the top end, and reference numeral 42 denotes a bottom exterior metal frame disposed on the bottom end. The top and bottom exterior metal frames 41 and 42 may operate as antenna radiators of the electronic device 400, and may be connected to the PCB 43 by the antenna contacts 410, 420, and 422. Each of the antenna contacts 410, 420, and 422 refers to a connection terminal, and may be formed in the form of an elastic clip.

According to various embodiments, the PCB 43 may include a plurality of electronic components which are mounted on a region adjacent to the top exterior metal frame 41 through an SMD (surface mounting device) process. In particular, high data processing units, or chips, such as a camera chip 430, an application processor (AP) 431, a (CP) communication processor 432, and a sensor, may be disposed or mounted on PCB 43. The PCB 43 may be connected to the bottom exterior metal frame 42 using cables 421 and 423, and the plurality of electronic components may be mounted through an SMD process.

According to various embodiments, the PCB 43 may be supported by a support structure, which may be coupled to the exterior metal frames 41 and 42. For example, since at least one of the exterior metal frames 41 and 42 operates as an antenna radiator, the support structure may be configured such that each of the exterior metal frames 41 and 42 is coupled to a portion made of an insulation material.

According to various embodiments, the support structure, which is positioned adjacent to the antenna contacts 410, 420, and 422 formed on the PCB 43, may be a non-metal region, and in a region where a circuit portion connected to the contacts on the PCB 43 is positioned in the metal region of the support structure, an electric path may be positioned such that the metal region and the PCB 43 may be electrically connected.

According to various embodiments, static electricity E may be generated on at least one of the exterior metal frames 41 and 42, and the generated static electricity may be transferred to the antenna contact 410 through the exterior metal frame 41. The generated static electricity passes through the PCB 43, and then the generated static electricity may be transferred to the metal region of the support structure through the electric path formed on the PCB without flowing to the high speed data processing units 430, 431, and 432 so that the high speed data processing units may be prevented from being temporarily or permanently damaged or from malfunctioning. According to various embodiments, the region A between the PCB 43 and the high speed data processing units 430, 431, and 432 may be prone to the generation of static electricity. In the region A, high speed data lines may be concentrated, and a camera chip 430 (see FIG. 5*a*), in which data is processed at a high speed (video imaging mode), may be positioned.

According to various embodiments, a ground structure may be additionally disposed in the region A. By the ground structure added to the region A, the static electricity generated through the exterior metal frame 41 may be transferred to the other portions without being applied to the high speed data processing units (lines) 430, 431, and 432.

Figure 5A:
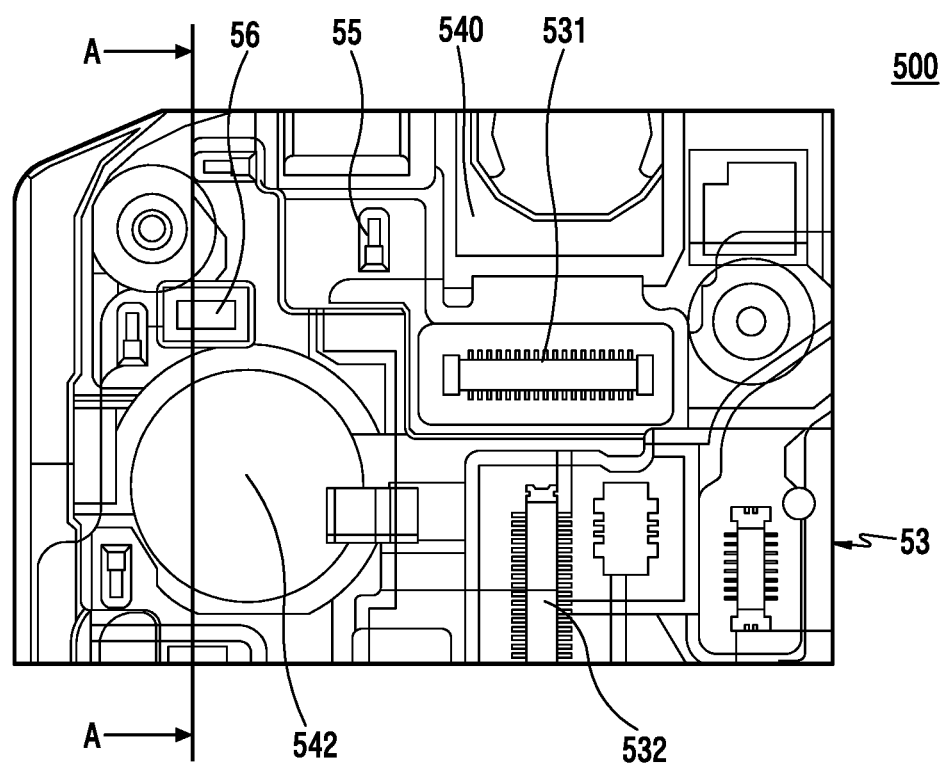
FIG. 5A is a plan view illustrating an inner configuration of an electronic device according to various embodiments of the present disclosure.
Figure 5B:
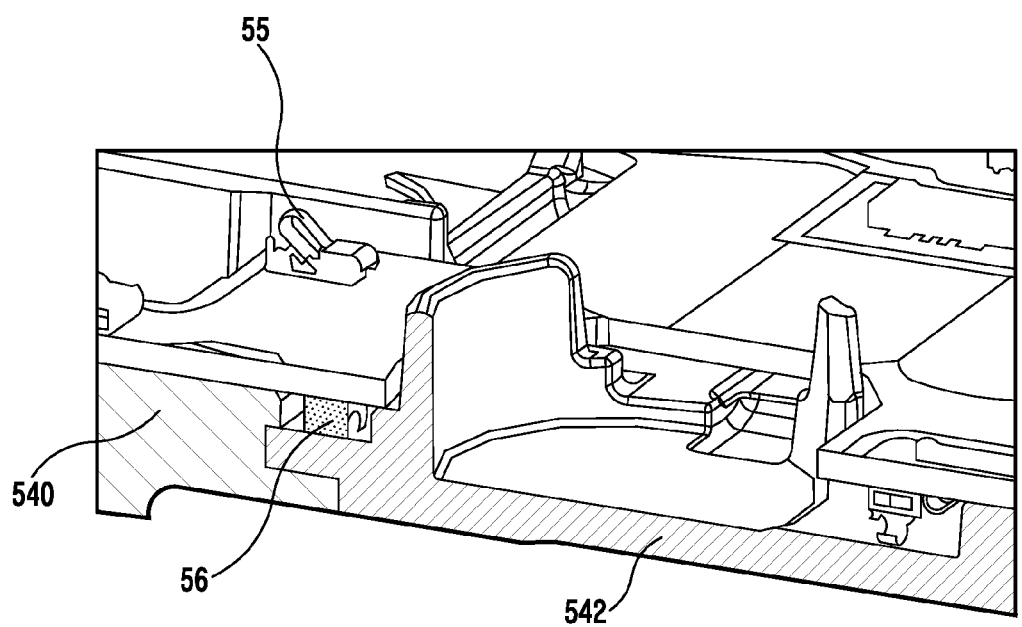
FIG. 5B is a sectional perspective view taken along line A-A in FIG. 5A.

FIG. 5A is a plan view illustrating an inner configuration of an electronic device, and FIG. 5B is a sectional view taken along line A-A in FIG. 5A. The electronic device 500 illustrated in FIGS. 5A and 5B may be an electronic device that is the same as the electronic device 100 illustrated in FIGS. 1 and 2.

Referring to FIGS. 5A and 5B, a high speed data unit may exist adjacent to the first electric path 55, the second electric path 56, or at least one of the electric paths which are connected to first and second electric patterns. According to various embodiments, it is highly probable that the static electricity generated on the exterior metal frames may be directed toward a front camera chip 531 and a rear camera chip 532 which exist at a place adjacent to the above-mentioned paths. However, the flow direction of the static electricity, which is directed toward the chips or the high speed data processing unit, may be changed by the second electric path 56. For example, the support structure may include a metal region 542 and a non-metal region 540, and the second electric path 56 may be disposed to be connected with the metal region 542. The static electricity, which has flowed to the second electric path 56, is grounded to the metal region 542 of the support structure so that the front camera chip 531 or the rear camera chip 532, which are disposed on the PCB 53, may be prevented in advance from, for example, temporarily malfunctioning or being permanently destroyed due to the static electricity. It is not necessary to limit the high speed data processing units close to first electric path 55 to the front and rear camera chips 531 and 532, AP, CP, etc. The support structure may be a portion in which the non-metal region 540 coupled to the metal region 542 is coupled to the exterior metal frames. In addition, according to various embodiments, the high speed data processing unit may include a circuit that performs a serial communication (e.g., an MIPI (mobile industry processor interface)).

Figure 6:
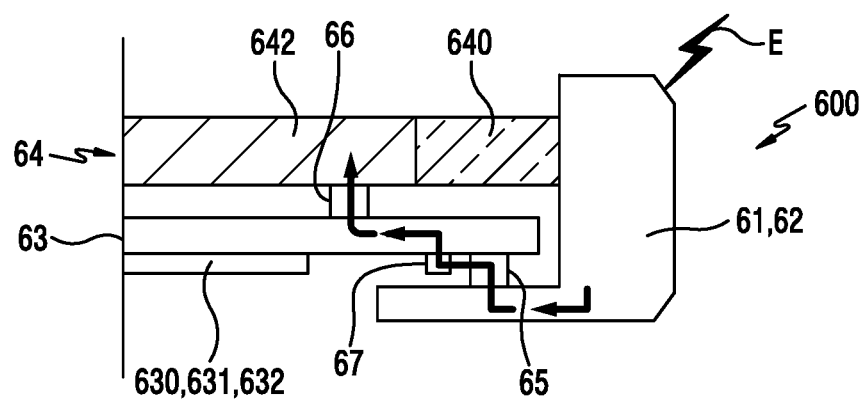
FIG. 6 is a view illustrating a path of static electricity generated on an exterior metal frame according to various embodiments of the present disclosure when the static electricity flows to a support structure.

FIG. 6 is a view illustrating a path of static electricity generated on an exterior metal frame according to various embodiments of the present disclosure when the static electricity flows to a support structure. The electronic device 600 illustrated in FIG. 6 may be the same as the electronic device 100 illustrated in FIGS. 1 and 2.

According to various embodiments, when static electricity E is generated on an exterior metal frame 61, the generated static electricity E may flow to a second PCB 63 through a first electric path 65. According to various embodiments, in a case where static electricity E is generated on the exterior metal frame 61, the PCB 63 is configured to include a capacitor 67. Without being limited thereto, however, the PCB 63 may not include the capacitor 67. According to various embodiments of the present disclosure, a static electricity prevention structure may be or may not be provided with the capacitor.

According to various embodiments, the electronic device 600 may include exterior metal frames 61 and 62, a PCB 63, first and second electric paths 65 and 66, and a capacitor 67. According to various embodiments, the capacitor 67 may be mounted on the PCB 63 through an SMT (surface mount technology) process, may be bonded to the bottom surface of the first and second electric paths 65 and 66, or may be mounted on the PCB by insertion.

According to various embodiments, the exterior metal frames may include a plurality of portions that may be spaced apart from each other by a non-conductive material to operate as antenna radiators, respectively. At least one exterior metal frame may include first and second exterior metal frames 61 and 62, which correspond to the first and second exterior metal frames 41 and 42 illustrated in FIG. 4. According to various embodiments, the first and second exterior metal frames 61 and 62 may operate as antenna radiators of the electronic device 600. The first and second exterior metal frames 61 and 62 may be electrically connected with the PCB 63 via the first electric path 65. According to various embodiments, each of the first and second electric paths 65 and 66 is an antenna contact, which correspond to the antenna contacts illustrated in FIG. 4. Each of the first and second electric paths 65 and 66 may be configured as a connection terminal in the form of an elastic clip.

According to various embodiments, the first electric path 65 may electrically connect at least one exterior metal frame 61 and the PCB 63 with each other. The first electric path 65 may be configured in the form of a clip.

According to various embodiments, the second electric path 66 may be disposed between the PCB 63 and the metal region 642 of the support structure to be electrically connected with the first electric path 65. The second electric path 66 may be disposed between a first surface of the PCB 63 and a first surface of the metal region 642 of the support structure, which faces the PCB. The second electric path 66 may be made of a conductor or a connection terminal in the form of a clip.

According to various embodiments, one or more electronic components may be mounted on the PCB 63 in a region adjacent to the first exterior metal frame 61 in an SMD manner. In particular, at least some of the chips, such as a camera chip 630, an AP 631, a CP 632, and a sensor, which are the components that process data at a high speed, may be disposed in the region (see also FIG. 4).

According to various embodiments, the PCB 63 may be supported by the support structure 64, which may be coupled to at least one of the first and second exterior metal frames 61 and 62. According to various embodiments, the support structure 64 is a structure that stably supports the PCB 63, and may support at least one of the first and second exterior metal frames 61 and 62. According to various embodiments, the first and second exterior metal frames 61 and 62 may operate as antenna radiators.

According to various embodiments, the support structure 64 may include a metal region 642 and a non-metal region 640. For example, a coupling portion may be formed by the non-metal region 640, and the remainder may be formed by the metal region 642. According to various embodiments, at least one region of the support structure 64 may be configured at the non-metal region 640 to be coupled to each of the first and second exterior metal frames 61 and 62. According to various embodiments, the metal region 642 may be disposed to be spaced apart from the PCB 63 in the vertical direction.

According to various embodiments, a first surface of the PCB 63 may be electrically connected to a first surface of the support structure 64 using the second electric path 66. The second electric path 66 may be disposed between the PCB 63 and the metal region 642 of the support structure so as to serve as a path that discharges static electricity to the metal region 642, as described below. According to various embodiments, the second electric path 66 may be made of a conductor, and may also be made of a contact terminal or the like in the form of a C-clip, like an antenna contact, or a shape having an elastic free end.

According to various embodiments, when static electricity E is generated on the exterior metal frames 61 and 62, the generated static electricity E may proceed to the capacitor 67 through the first electric path 65, and may then flow to the PCB 63. After flowing to the PCB 63, the static elasticity E may flow to the metal region 642 of the support structure via the second electric path 66, rather than being directed toward high speed data processing units 630, 631, and 632 disposed on the PCB 63. The arrows shown in FIG. 6 indicates the flow of static electricity E.

According to various embodiments, among one or more exterior metal frames, when static electricity E is generated on at least one exterior metal frame 61 or 62, the generated static electricity may flow to the PCB 63 via the first electric path 65 and the capacitor 67. After flowing to the PCB, the static electricity E may flow to the metal region 642 of the support structure 64 through the second electric path 66 and may then be discharged. In other words, an electric shock by the static electricity generated on the at least one exterior metal frame 61 or 62 may be prevented.

According to various embodiments, the generated electricity E may inflow to an electric path to the PCB 63 through the first electric path 65, and may flow to the PCB 63 via the capacitor 67 mounted in the electric path. The electric path may be an antenna circuit, and the capacitor may be a capacitor configured in the antenna circuit.

Figure 7:
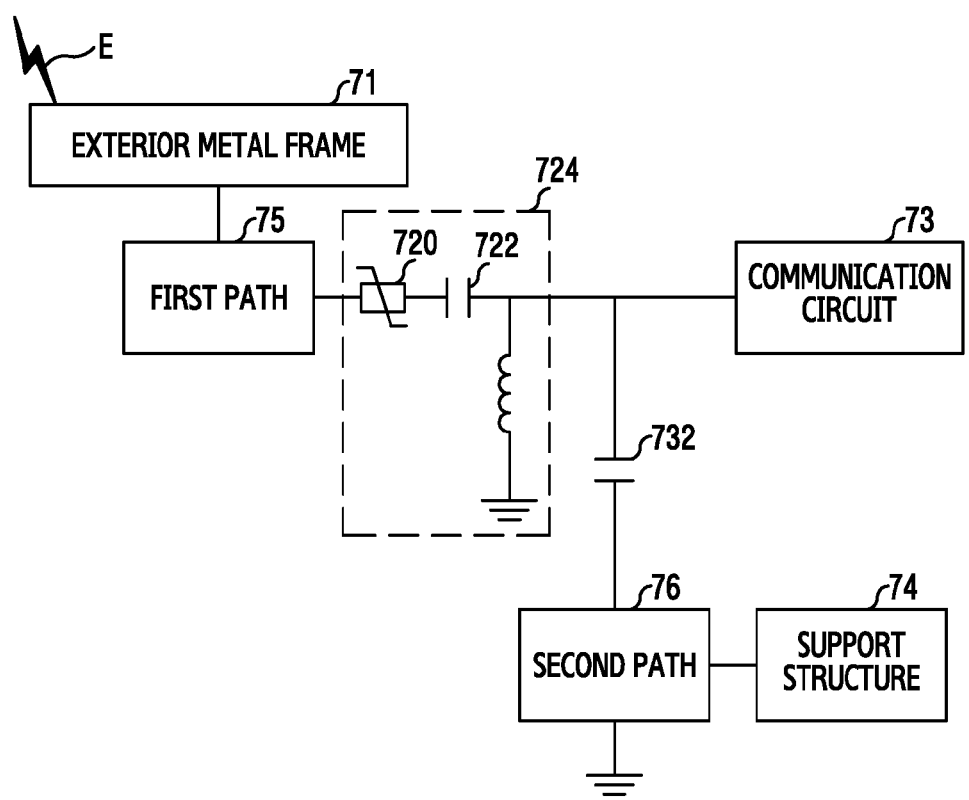
FIG. 7 is a circuit diagram illustrating a configuration of an electric path, through which the static electricity generated on an exterior metal frame according to various embodiments of the present disclosure flows to a support structure.

FIG. 7 is a circuit diagram illustrating a configuration of an electric path, through which the static electricity generated on an exterior metal frame according to various embodiments of the present disclosure flows to a support structure.

Descriptions will be made of the actions of the static electricity that is generated on the exterior metal frame which flows to the metal region of the support structure through first and second paths with reference to FIG. 7. The first and second electric paths 75 and 76 illustrated in FIG. 7 correspond to the first and second electric paths 65 and 66 illustrated in FIG. 6.

According to various embodiments, the static electricity E generated on the exterior metal frame 71 may flow toward a communication circuit 73 of the PCB through the first electric path 75. According to various embodiments, after flowing to the PCB toward the communication circuit, the static electricity E may be prevented from flowing to the communication circuit 73 (high speed data processing unit) of the PCB through the second path. For example, a TVS diode 720 that prevents an overvoltage or a discharge sensing capacitor 722 that prevents an overcurrent may be configured as a passive element 724 and may be disposed between the first path 75 and the communication circuit 73.

According various embodiments, an electronic device may include the first and second electric paths 75 and 76, and may cause the generated static electricity E to flow the metal region of the support structure 74. For example, the static electricity E generated on the exterior metal frame 71 may flow to a second capacitor 732 via the first electric path 75. After flowing to the second capacitor 732, the static electricity E may flow to the metal region of the support structure 74 through the second electric path 76 and then may be discharged. According to various embodiments, the second capacitor 732 may be disposed at a signal input terminal or a signal output terminal of the passive element 724. According to various embodiments, the second capacitor 732 and the second electric path 76 may commonly use a ground. For example, the ground may be formed in a pattern that interconnects the second capacitor 732 and the second electric path 76.

Figure 8:
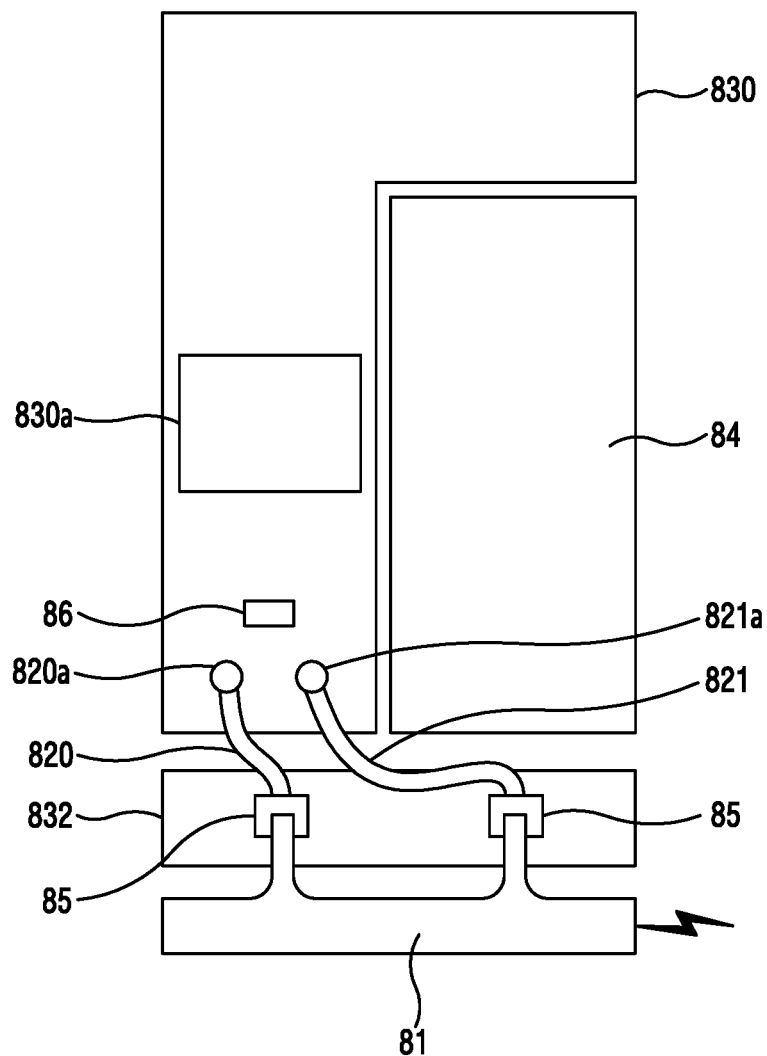
FIG. 8 is a view illustrating a connection state of first and second boards and an exterior metal frame according to various embodiments of the present disclosure.

FIG. 8 is a view illustrating a connection state of first and second PCBs and an exterior metal frame according to various embodiments of the present disclosure.

Referring to FIG. 8, the PCB may be composed of first and second PCBs 830 and 832, which are spaced apart from each other while being disposed close to a battery pack 84 along mounting spaces thereof in the electronic device. First and second electric paths 85 and 86 illustrated in FIG. 8 correspond to the first and second electric paths 65 and 66 illustrated in FIG. 6.

According to various embodiments, the first PCB 830 may be electrically connected to the second PCB 832. For example, the first PCB 830 may be electrically connected to the second PCB 832 by a coaxial cable 820, 821. According to various embodiments, at least one high speed data processing unit 830a may be disposed on the first PCB 830, in which the high speed data processing unit 830a may include at least one of an AP, a CP, a sensor unit, and at least one camera. According to various embodiments, each coaxial cable 820 or 821 may be an electric path that electrically connects the first and second PCBs with each other. For example, each of the first and second PCBs 830 and 832 may be made of a rigid material or a flexible material. According to various embodiments, the exterior metal frame 81 may be connected to the second PCB 832 by the first electric path 85. The first electric path 85 is an antenna contact and may be configured in the form of a clip. The first PCB 830 may be electrically connected with a metal region of a support structure by the second electric path 86. A configuration, in which the first PCB 830 is electrically connected to the metal region of the support structure by the second electric path 86 according to various embodiments (see FIG. 6), has been already described in detail, an additional description will be omitted.

According various embodiments, when static electricity is generated on the exterior metal frame 81, the static electricity may flow through the first electric path 85 and along the coaxial cables 820 and 821. Subsequently, after passing through the coaxial cables 820 and 821, the static electricity may arrive at the first PCB 830. According to various embodiments, the second electric path 86 may be disposed between the coaxial cable starting points 820a and 821a of the first PCB 830 and a high speed data processing unit 830a may cause the static electricity flowing path to be directed toward the metal region via the second electric path 86 while preventing the static electricity flowing path from flowing toward the high speed data processing unit 830. Subsequently, after passing through the second electric path 86, the static electricity may be discharged in the metal region.

Figure 9:
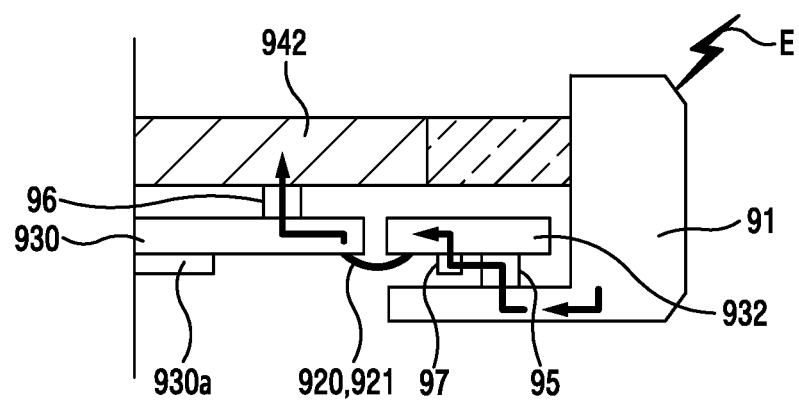
FIG. 9 is a view illustrating a path of static electricity generated on an exterior metal frame according to various embodiments of the present disclosure when the static electricity flows to a support structure.

FIG. 9 is a view illustrating a path of static electricity generated on an exterior metal frame according to various embodiments of the present disclosure when the static electricity flows to a support structure. First and second electric paths 95 and 96 illustrated in FIG. 9 correspond to first and second electric paths 65 and 66 illustrated in FIG. 6. When static electricity E is generated on an exterior metal frame 91, the generated static electricity E may flow to a capacitor 97 through the first electric path 95, and then the static electricity may flow to the first PCB 932. According to various embodiments, after flowing to the first PCB 932, the static electricity E may flow through second PCB 930 to a metal region 942 of a support structure by the second electric path 96, rather than being directed toward a communication circuit (high speed data processing unit) 930a disposed on the second PCB 930 through the coaxial cables 920 and 921. The arrows indicated in FIG. 9 indicate that the static electricity E flows.

According to various embodiments, when static electricity E is generated on the exterior metal frame 91, the generated static electricity E may flow to the second PCB 930 without passing through the capacitor 97 via the first electric path 95.

According to various embodiments, when static electricity E is generated on the exterior metal frame 91, the PCB is configured to include the capacitor 97. Without being limited thereto, however, the PCB may not include the capacitor 97.

According to various embodiments, when static electricity E is generated on at least one exterior metal frame 91 among one or more exterior metal frames, the generated static electricity flows to the coaxial cables 920 and 921 through the first electric path 95 and via the capacitor 97. According to various embodiments, the static electricity E flows to the metal region 942 through the second electric path 96 and may be discharged from the metal region 942. According to various embodiments, it is possible to prevent an electric shock by the static electricity E that is generated on the exterior metal frame 91.

Figure 10:
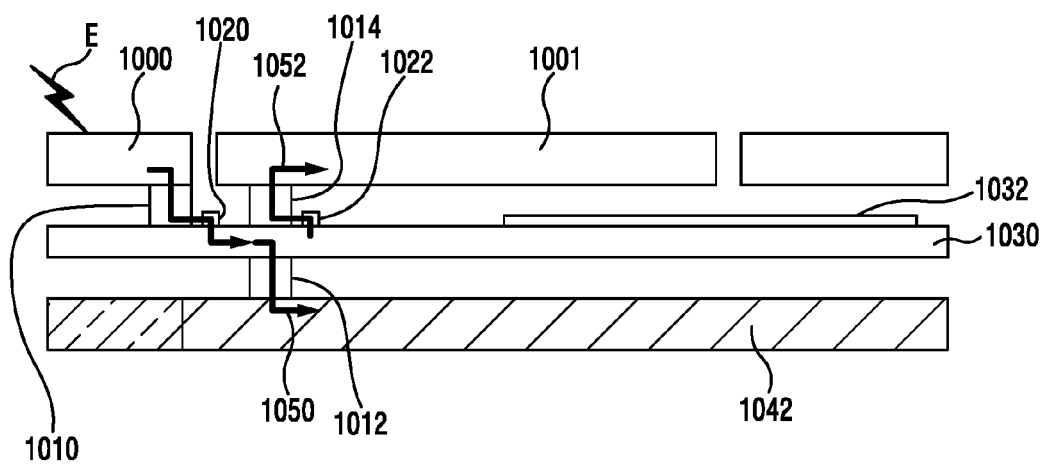
FIG. 10 is a view illustrating paths of static electricity generated on one exterior metal frame according to various embodiments of the present disclosure when the static electricity flows to a support structure and another exterior metal frame.

FIG. 10 is a view illustrating paths of static electricity generated on one exterior metal frame according to various embodiments of the present disclosure when the static electricity flows to a support structure and another exterior metal frame.

Referring to FIG. 10, an electronic device may include one or more exterior metal frames 1000 and 1001, a PCB 1030, first, second, and third electric paths 1010, 1012, and 1014, and one or more capacitors (e.g., first and second capacitors 1020 and 1022).

The one or more exterior metal frames may include a first portion 1000 that is in contact with the first electric path, and a second portion 1001 spaced apart from the first portion 1000 by a non-conductive material.

According to various embodiments of the present disclosure, when static electricity E is generated on the first portion 1000 of the exterior metal frame 1000, the generated static electricity E may proceed to the first capacitor 1020 through the first electric path 1010, and may flow to the PCB 1030 through the capacitor 1020. After flowing to the PCB 1030, the static electricity may flow toward the second electric path 1012. The static electricity E may be discharged to a metal region 1042 of the support structure through the second electric path 1012 without being directed to a high speed data processing unit 1032 disposed on the PCB 1030.

In the electronic device according to various embodiments, the static electricity E generated on the first portion of the exterior metal frame 1000 may be discharged to at least one region of the other exterior metal frame 1001 through a third path 1014. The second electric path 1012 may be disposed between the PCB 1030 and the metal region 1042 of the support structure so as to form a path, through which the static electricity E may flow to the metal region 1042.

The third electric path 1014 may be disposed between the PCB 1030 and the exterior metal frame 1001 so as to serve as an electric path that allows the static electricity E to flow to the exterior metal frame 1001. Each of the second and third electric paths 1012 and 1014 may be formed of a conductor, and may be configured in the form of a C-clip or a connection terminal shape having an elastic free end similar to the first electric path 1010. In FIG. 10, the arrows 1050 and 1052 indicate the directions in which the static electricity E flows.

According to various embodiments of the present disclosure, the generated static electricity E may be discharged to other metallic bodies, rather than to the exterior metal frame 1001. For example, the other metallic bodies may be a metallic rear case, a metallic back cover, a metallic camera case frame, a metallic component case (such as a USB connector case), or the like.

When the static electricity E is generated on the exterior metal frame 1000, the generated static electricity may flow to the metal region 1042 of the support structure or the other metal frame 1001 so as to prevent the damage of the PCB, electric shock to a human body, or the like. While it has been disclosed that static electricity is generated on the exterior metal frame 1000, the static electricity may be generated on the other exterior metal frame 1001 or metallic body and the principle of discharging the static electricity may be the same as that described above.

Figure 11:
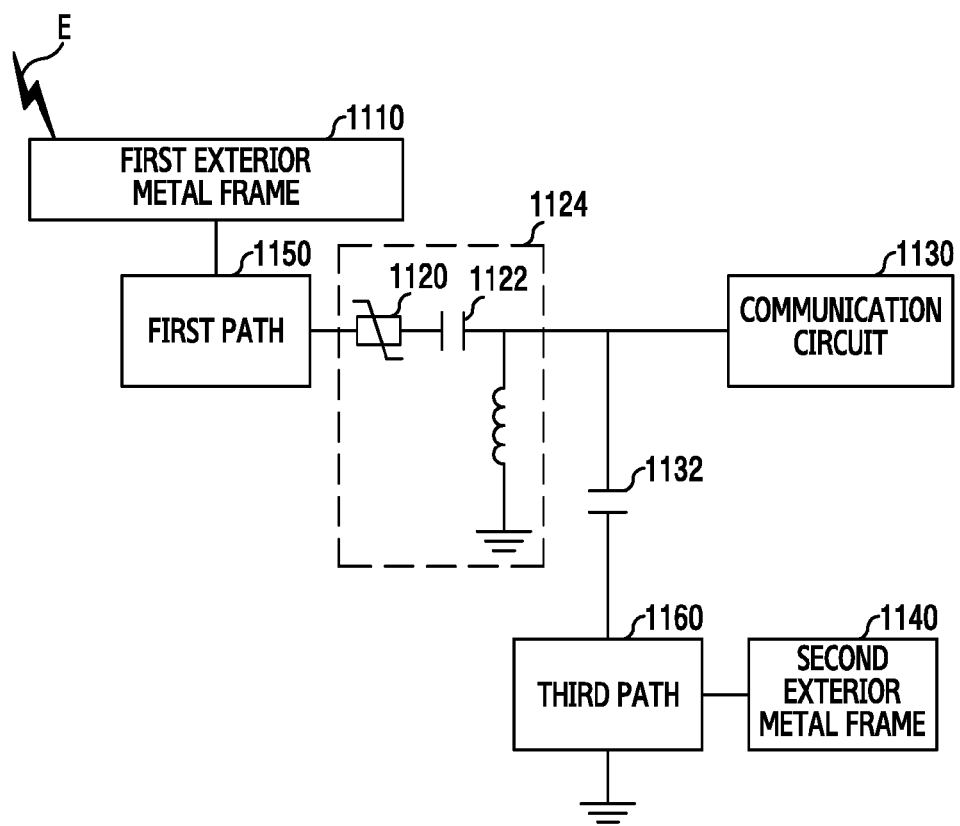
FIG. 11 is a circuit diagram illustrating a configuration, in which static electricity generated on an exterior metal frame according to various embodiments of the present disclosure flows to a support structure.

FIG. 11 is a circuit diagram illustrating a configuration, in which static electricity generated on an exterior metal frame according to various embodiments of the present disclosure flows to a support structure.

Descriptions will be made of a process, in which static electricity generated on an exterior metal frame flows through to a metal region of the support structure through first and third paths, with reference to FIG. 11.

Referring to FIG. 11, the static electricity E generated on the exterior metal frame 1110 may flow toward a communication circuit 1130 of the PCB through a first electric path 1150. In the PCB, after flowing toward the communication circuit 1130, the static electricity E is prevented from flowing to the communication circuit 1130 (a high speed data processing unit) of the PCB through the second path. For example, a TVS diode 1120 that prevents an overvoltage and a discharge sensing capacitor 1122 may be configured as a passive element 1124, and may be disposed between the first path 1150 and the communication circuit 1130.

According to various embodiments, the electronic device is provided with first and third electric paths 1150 and 1160 so that the generated static electricity E may flow to a second exterior metal frame 1140. The static electricity E generated on the exterior metal frame 1110 may flow to the second capacitor 1132 via the first electric path 1150. After flowing to the second capacitor 1132, the static electricity E may flow to the exterior metal frame 1140 through the third electric path 1160 to be discharged. The second capacitor 1132 may be disposed at a signal input terminal or a signal output terminal of the passive element 1124. The second capacitor 1132 and the third electric path 1160 may use a common ground. For example, a ground may be formed in the pattern that interconnects the second capacitor 1132 and the third electric path 1160.

For example, the second exterior metal frame 1140 may be a metallic rear case, a metallic back cover, a metallic camera case frame, a metallic component case (such as USB connector case), a stainless use steel case (SUS) of a receiver, or the like.

According to various embodiments, the static electricity generated on one exterior metal frame may flow to the other exterior metal frame to be discharged, or may flow to another metallic body to be grounded.

According to various embodiments of the present disclosure, the second electric path may be disposed between a first surface of the PCB and a first region of the metal region of the support structure facing the first region of the PCB.

The second electric path may be made of a conductor or a connection terminal in a form of a clip.

The first electric path may be configured in a form of a clip.

The metal region may be disposed to be spaced apart from the one surface of the PCB in a vertical direction.

When static electricity is generated on one or more exterior metal frames, the generated static electricity may be discharged to the metal region of the support structure through the first electric path and the second electric path.

According to various embodiments of the present disclosure, the electronic device may further include one or more high speed data processing units that are disposed on the PCB. The first electric path and the second electric path may be configured to prevent the static electricity, which is generated on the at least one exterior metal frame, from flowing to the high speed data processing units.

The one or more high speed data processing units may include at least one of an AP, a CP, a sensor unit, and at least one camera.

Among the high speed data processing units, the camera may be disposed adjacent to the first electric path.

The at least one exterior metal frame may further include a third electric path that is disposed between a second portion, which is spaced by a non-conductive material, apart from a first portion that is in contact with the first electric path, and the PCB.

The static electricity generated on the at least one exterior metal frame may be directed toward the PCB through at least one of the first electric path and the third electric path, and may be discharged to a second portion of the at least one exterior metal frame by the third electric path.

The second portion of the at least one exterior metal frame may include a metallic rear case, a metallic back cover, or a metallic component case.

The at least one exterior metal frame may include a plurality of portions that are spaced apart from each other by a non-conductive material to operate as antenna radiators.

The at least one exterior metal frame may include an upper end exterior metal frame and a lower end exterior metal frame which are positioned on upper and lower ends of the electronic device, respectively.

According to various embodiments of the present disclosure, the support structure may include a first and second segmented antenna radiator.

Each of the first and second segmented antenna radiators may include an outer peripheral metal frame of the electronic device.

When static electricity is generated on the first segmented antenna radiator, the generated static electricity may be discharged to the metal region of the support structure through the first and second contact.

Each of the first and second contacts is made of a conductor or a terminal in a form of a clip.

The second segmented antenna radiator may include a metallic rear case, a metallic back cover, or a metallic component case.

Figure 12:
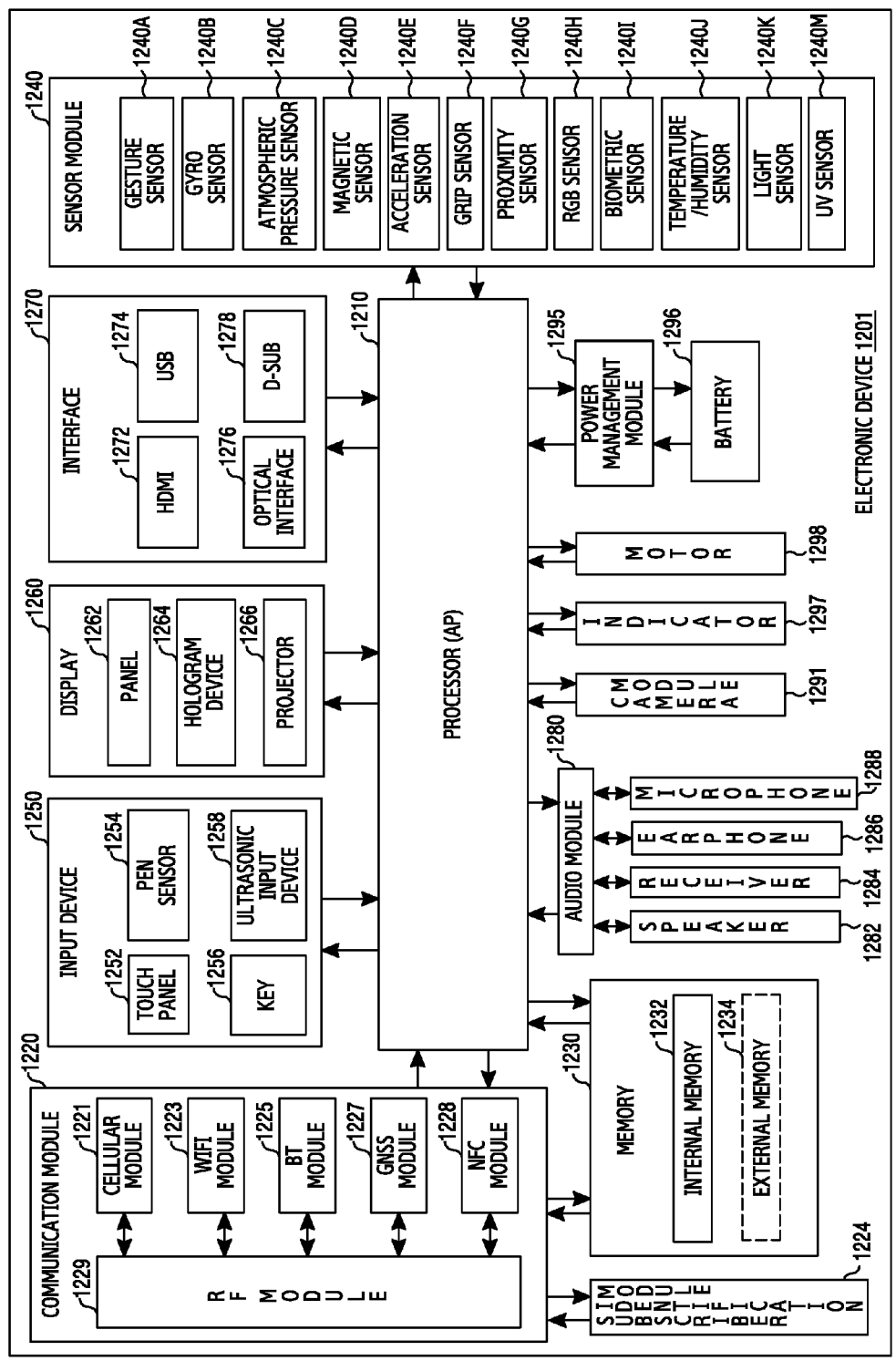
FIG. 12 is a block diagram of an electronic device according to various embodiments of the present disclosure.

FIG. 12 illustrates a block diagram of an electronic device according to various exemplary embodiments of the present disclosure. The electronic device 1201 may configure the entirety or part of the electronic device 100 shown in FIG. 1. The electronic device 1201 may include one or more Application Processors (APs) 1210, a communication module 1220, a Subscriber Identification Module (SIM) card 1224, a memory 1230, a sensor module 1240, an input device 1250, a display 1260, an interface 1270, an audio module 1280, a camera module 1291, a power management module 1295, a battery 1296, an indicator 1297, and a motor 1298.

The AP 1210 may control a plurality of hardware or software elements connected to the AP 1210 by driving an operating system or an application program, and may process and calculate a variety of data including multimedia data. For example, the AP 1210 may be implemented by using a System on Chip (SoC). According to an embodiment, the AP 1210 may further include a Graphic Processing Unit (GPU).

The communication module 1220 may transmit and receive data via communication between the electronic device 1201 and other electronic devices connected through a network. The communication module 1220 may include a cellular module 1221, a WiFi module 1223, a Bluetooth (BT) module 1225, a global positioning system (GNSS) module 1227, a near field communication (NEC) module 1228, and a Radio Frequency (RF) module 1229.

The cellular module 1221 may provide a voice call, a video call, a text service, or an Internet service through a telecommunications network (for example, LTE, LTE-A, CDMA, WCDMA, UMTS, WiBro, GSM, and the like). In addition, the cellular module 1221 may identify and authenticate the electronic device in the telecommunications network by using the subscriber identification module 1224. According to an embodiment, the cellular module 1221 may perform at least some of the functions provided by the AP 1210. For example, the cellular module 1221 may perform at least some of the multimedia control functions.

According to an embodiment, the cellular module 1221 may include a Communication Processor (CP). In addition, the cellular module 1221 may be implemented by using an SoC, for example. In FIG. 12, the cellular module 1221 (for example, the communication processor), the memory 1230, or the power management module 1295 are elements separate from the AP 1210. However, the AP 1210 may be configured to include at least some of the above-described elements.

The AP 1210 or the cellular module 1221 may load instructions or data received from a non-volatile memory connected therewith or at least one of the other elements into a volatile memory, and may process the instructions or data. In addition, the AP 1210 or the cellular module 1221 may store data which is received from at least one of the other elements or generated by at least one of the other elements in the non-volatile memory.

The WiFi module 1223, the BT module 1225, the GPS module 1227, or the NEC module 1228 each may include a processor for processing data received and transmitted through a corresponding module. In FIG. 12, the cellular module 1221, the WiFi module 1223, the BT module 1225, the GPS module 1227, and the NEC module 1228 are illustrated in separate blocks. However, at least some (for example, two or more) of the cellular module 1221, the WiFi module 1223, the BT module 1225, the GPS module 1227, and the NEC module 1228 may be included in a single integrated chip (IC) or a single IC package. For example, at least some of the processors corresponding to the cellular module 1221, the WiFi module 1223, the BT module 1225, the GPS module 1227, and the NEC module 1228 (for example, the communication processor corresponding to the cellular module 1221 and the WiFi processor corresponding to the WiFi module 1223) may be implemented by using a single SoC.

The RF module 1229 may transmit and receive data, for example, may transmit and receive an RF signal. Although not shown, the RF module 1229 may include a transceiver, a Power Amp Module (PAM), a frequency filter, or a Low Noise Amplifier (LNA), for example. In addition, the RF module 1229 may further include a part for exchanging electromagnetic waves in a free space in wireless communication, such as a conductor or conducting wire. In FIG. 12, the cellular module 1221, the WiFi module 1223, the BT module 1225, the GPS module 1227, and the NEC module 1228 share the single RF module 1229 with one another. However, at least one of the cellular module 1221, the WiFi module 1223, the BT module 1225, the GPS module 1227, and the NEC module 1228 may transmit and receive an RF signal through a separate RF module.

The SIM card 1224 may be inserted into a slot formed on a specific location of the electronic device. The SIM card 1224 may include unique identification information (for example, an Integrated Circuit Card Identifier (ICCID)) or subscriber information (for example, International Mobile Subscriber Identity (IMSI)).

The memory 1230 may include an internal memory 1232 or an external memory 1234. For example, the internal memory 1232 may include at least one of a volatile memory, such as, a Dynamic Random Access Memory (DRAM), a Static Random Access Memory (SRAM), a Synchronous DRAM (SDRAM), etc. and a non-volatile memory, such as a One-Time Programmable Read Only Memory (OTPROM), a Programmable Read Only Memory (PROM), an Erasable Programmable Read Only Memory (EPROM), an Electrically Erasable Programmable Read Only Memory (EEPROM), a mask ROM, a flash ROM, a NAND flash memory, a NOR flash memory, etc.).

The internal memory 1232 may be a Solid State Drive (SSD). The external memory 1234 may further include a flash drive, such as a, Compact Flash (CF), Secure Digital (SD), Micro-SD, Mini-SD, extreme-Digital (xD), a memory stick, etc. The external memory 1234 may be functionally connected with the electronic device 1201 through various interfaces. The electronic device 1201 may further include a storage device (or a storage medium) such as a hard drive.

The sensor module 1240 may measure a physical quantity or detect an operation state of the electronic device 1201, and may convert measured or detected information into electric signals. The sensor module 240 may include at least one of a gesture sensor 1240A, a gyro sensor 1240B, an atmospheric pressure or barometric pressure sensor 1240C, a magnetic sensor 1240D, an acceleration sensor 1240E, a grip sensor 1240F, a proximity sensor 1240G a color sensor 1240H (e.g., Red, Green, Blue (RGB) sensor), a biometric sensor 1240I, a temperature/humidity sensor 1240J, an illumination or light sensor 1240K, and a Ultraviolet (UV) sensor 1240M. Additionally or alternatively, the sensor module 1240 may include an E-nose sensor, an electromyography (EMG) sensor, an electroencephalogram (EEG) sensor, an electrocardiogram (ECG) sensor, an infrared ray (IR) sensor, an iris sensor, a fingerprint sensor, and the like. The sensor module 1240 may further include a control circuit to control at least one sensor included therein.

The input device 1250 may include a touch panel 1252, a (digital) pen sensor 1254, a key 1256, and an ultrasonic input device 1258. The touch panel 1252 may recognize a touch input in at least one of a capacitive, resistive, infrared, and ultrasonic method. In addition, the touch panel 1252 may further include a control circuit. In the a capacitive method, the touch panel 1252 may recognize physical contact or hovering. The touch panel 1252 may further include a tactile layer. In this embodiment, the touch panel 1252 may provide a tactile response to the user.

The (digital) pen sensor 1254 may be implemented in the same or similar method as or to the method of receiving a user's touch input or by using a separate detection sheet. The key 1256 may include a physical button, an optical key, or a keypad. The ultrasonic input device 1258 allows the electronic device 1201 to detect sound waves through a microphone 1288 through an input tool generating ultrasonic signals and identify data, and is capable of wireless recognition. According to an embodiment, the electronic device 1201 may receive a user input from an external device connected thereto (for example, a computer or a server) by using the communication module 1220.

The display 1260 may include a panel 1262, a hologram device 1264, and a projector 1266. For example, the panel 1262 may be a Liquid Crystal Display (LCD) or an Active Matrix Organic Light Emitting Diode (AM-OLED). The panel 1262 may be implemented to be flexible, transparent, or wearable, and may be configured as a single module along with the touch panel 1252 of input device 1250. The hologram device 1264 may show a stereoscopic image in air using interference of light. The projector 1266 may display an image by projecting light onto a screen. The screen may be located inside or outside the electronic device 1201. According to an embodiment, the display 1260 may further include a control circuit to control the panel 1262, the hologram device 1264, or the projector 1266.

The interface 1270 may include a High Definition Multimedia Interface (HDMI) 1272, a Universal Serial Bus (USB) 1274, an optical interface 1276, or D-subminiature (sub) 1278. Additionally or alternatively, the interface 1270 may include a Mobile High Definition Link (MHL) interface, a Secure Digital (SD)/Multimedia Card (MMC) interface or Infrared Data Association (IrDA) standard interface.

The audio module 1280 may convert a sound and an electric signal bidirectionally. The audio module 1280 may process sound information which is input or output through a speaker 1282, a receiver 1284, an earphone 1286, or the microphone 1288.

The camera module 1291 is a device for photographing a still image and a moving image, and, according to an exemplary embodiment, the camera module 1291 may include one or more image sensors (for example, a front surface sensor or a rear surface sensor), a lens, an Image Signal Processor (ISP), or a flash (memory) (for example, a Light Emitting Diode (LED) or a xenon lamp).

The power management module 1295 may manage power of the electronic device 1201. Although not shown, the power management module 1295 may include a Power Management IC (PMIC), a charger IC, or a battery gauge.

For example, the PMIC may be mounted in an integrated circuit or an SoC semiconductor. The charging method may be a wire charging method and a wireless charging method. The charger IC may charge a battery and may prevent inflow of overvoltage or over current from a charger. According to an embodiment, the charger IC may include a charger IC for at least one of the wire charging method and the wireless charging method. The wireless charging method may include a magnetic resonance method, a magnetic induction method, or an electromagnetic wave method, and an additional circuit for charging wirelessly, for example, a circuit such as a coil loop, a resonant circuit, a rectifier, and the like may be added.

For example, the battery gauge may measure a remaining battery life of the battery 1296, a voltage, a current, or temperature during charging. The battery 1296 may store or generate electricity and may supply power to the electronic device 1201 by using stored or generated electricity. The battery 1296 may include a rechargeable battery or a solar battery.

The indicator 1297 may display a specific state of the electronic device 1201 or a part of it (for example, the AP 1210), for example, a booting state, a message state, or a charging state. The motor 1298 may convert an electric signal into a mechanical vibration. Although not shown, the electronic device 1201 may include a processing device (for example, a GPU) for supporting a mobile TV. The processing device for supporting the mobile TV may process media data according to standards such as Digital Multimedia Broadcasting (DMB), Digital Video Broadcasting (DVB), or media flow (MediaFlo).

Each of the above-described elements of the electronic device according to various embodiments of the present disclosure may be comprised of one or more components, and the names of the elements may vary according to the kind of the electronic device. The electronic device according to various embodiments of the present disclosure may include at least one of the above-described elements, and some of the elements may be omitted or an additional element may be further included. In addition, some of the elements of the electronic device according to various embodiments of the present disclosure may be combined into a single entity, and may perform the same functions as those of the elements before being combined.

It will be appreciated that embodiments of the present invention according to the claims and description in this specification can be realized in the form of hardware, software or a combination of hardware and software.

Any such software may be stored in a computer readable storage medium. The computer readable storage medium stores one or more programs (software modules), the one or more programs comprising instructions, which when executed by one or more processors in an electronic device, cause the electronic device to perform a method of the present invention.

Any such software may be stored in the form of volatile or non-volatile storage such as, for example, a storage device like a ROM, whether or not erasable or rewritable, or in the form of memory such as, for example, RAM, memory chips, device or integrated circuits or on an optically or magnetically readable medium such as, for example, a CD, DVD, magnetic disk or magnetic tape or the like. It will be appreciated that the storage devices and storage media are embodiments of machine-readable storage that are suitable for storing a program or programs comprising instructions that, when executed, implement embodiments of the present invention.

Accordingly, embodiments provide a program comprising code for implementing apparatus or a method as claimed in any one of the claims of this specification and a machine-readable storage storing such a program. Still further, such programs may be conveyed electronically via any medium such as a communication signal carried over a wired or wireless connection and embodiments suitably encompass the same.

Although specific embodiments have been described in the detailed description of the present disclosure, various changes and modifications may be made without departing from the spirit and scope of the present disclosure. Therefore, the scope of the present invention should not be defined as being limited to the embodiments described herein, but should be defined by the appended claims and equivalents thereof.

What is claimed is:
1. An electronic device comprising:
   a housing;
   a printed circuit board disposed within the housing;
   a communication circuit disposed on the printed circuit board;

one or more high speed data processing units disposed on the printed circuit board;

at least one exterior metal frame forming at least a part of the housing, and is electrically connected with the communication circuit;

a first electric path electrically connecting the at least one exterior metal frame and the PCB with each other;

a support structure including a metal region and a non-metal region, and supporting the printed circuit board and/or the at least one exterior metal frame; and a second electric path disposed between the printed circuit board and the metal region of the support structure and is electrically connected with the first electric path, wherein the first electric path and the second electric path are configured to prevent static electricity, which is generated on the at least one exterior metal frame, from flowing to the one or more high speed data processing units.

2. The electronic device of claim 1, wherein the second electric path is disposed between a first surface of the printed circuit board and a first region of the metal region of the support structure facing the first region of the printed circuit board.

3. The electronic device of claim 2, wherein the second electric path comprises a conductor or a clip-type connection terminal.

4. The electronic device of claim 1, wherein the first electric path is configured in a form of a clip.

5. The electronic device of claim 1, wherein the metal region is spaced apart from one surface of the printed circuit board in a vertical direction.

6. The electronic device of claim 1, wherein, when static electricity is generated on the at least one exterior metal frame, the generated static electricity is discharged to the metal region of the support structure through the first electric path and the second electric path.

7. The electronic device of claim 1, wherein the one or more high speed data processing units include at least one of an application processor (AP), a communication processor (CP), a sensor unit, and at least one camera.

8. The electronic device of claim 7, wherein among the one or more high speed data processing units, the at least one camera is disposed adjacent to the first electric path.

9. The electronic device of claim 1, wherein the at least one exterior metal frame further includes a third electric path that is disposed between a second portion, which is spaced, by a non-conductive material, apart from a first portion that is in contact with the first electric path, and the printed circuit board.

10. The electronic device of claim 9, wherein the static electricity generated on the at least one exterior metal frame is directed toward the printed circuit board through at least one of the first electric path and the third electric path, and is discharged to the second portion of the at least one exterior metal frame by the third electric path.

11. The electronic device of claim 10, wherein the second portion of the at least one exterior metal frame includes one of a metallic rear case, a metallic back cover, and a metallic component case.

12. The electronic device of claim 1, wherein the at least one exterior metal frame includes a plurality of portions that are spaced apart from each other by a non-conductive material to operate as antenna radiators.

13. The electronic device of claim 12, wherein the at least one exterior metal frame includes an upper end exterior metal frame and a lower end exterior metal frame which are positioned on upper and lower ends of the electronic device, respectively.

14. An electronic device comprising:

a printed circuit board located within the electronic device;

one or more high speed data processing units disposed on the printed circuit board;

a first segmented antenna radiator forming at least a part of an exterior of the electronic device;

a first contact electrically connecting the first segmented antenna radiator and the printed circuit board with each other;

a support structure including a metal region and a non-metal region, and which supports the printed circuit board and/or the first segmented antenna radiator; and a second contact disposed between the printed circuit board and the metal region and is electrically connected with the first contact, wherein the first contact and the second contact are configured to prevent the static electricity, which is generated on the first segmented antenna radiator, from flowing to the one or more high speed data processing units.

15. The electronic device of claim 14, wherein the support structure includes a second segmented antenna radiator.

16. The electronic device of claim 15, wherein each of the first and second segmented antenna radiators includes an outer peripheral metal frame of the electronic device.

17. The electronic device of claim 15, wherein the second segmented antenna radiator includes one of a metallic rear case, a metallic back cover, and a metallic component case.

18. The electronic device of claim 14, wherein, when static electricity is generated on the first segmented antenna radiator, the generated static electricity is discharged to the metal region of the support structure through the first and second contacts.

19. The electronic device of claim 18, wherein each of the first and second contacts comprises one of a conductor or a clip-type terminal.

* * * * *